United States Patent
Lee

(10) Patent No.: US 9,306,092 B2
(45) Date of Patent: Apr. 5, 2016

(54) SOLAR CELL AND METHOD OF FABRICATING THE SAME

(75) Inventor: Jin Woo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 25 days.

(21) Appl. No.: 14/110,057

(22) PCT Filed: Apr. 4, 2012

(86) PCT No.: PCT/KR2012/002520
§ 371 (c)(1),
(2), (4) Date: Oct. 21, 2013

(87) PCT Pub. No.: WO2012/138117
PCT Pub. Date: Oct. 11, 2012

(65) Prior Publication Data
US 2014/0026957 A1    Jan. 30, 2014

(30) Foreign Application Priority Data
Apr. 4, 2011 (KR) .................. 10-2011-0030875

(51) Int. Cl.
| | |
|---|---|
| H01L 31/00 | (2006.01) |
| H01L 31/0232 | (2014.01) |
| H01L 31/0749 | (2012.01) |
| H01L 31/032 | (2006.01) |
| H01L 31/0352 | (2006.01) |
| H01L 31/0392 | (2006.01) |
| H01L 31/046 | (2014.01) |

(52) U.S. Cl.
CPC ...... *H01L 31/02327* (2013.01); *H01L 31/0322* (2013.01); *H01L 31/03923* (2013.01); *H01L 31/035281* (2013.01); *H01L 31/046* (2014.12); *H01L 31/0749* (2013.01); *Y02E 10/541* (2013.01); *Y02P 70/521* (2015.11)

(58) Field of Classification Search
USPC .......................... 977/700–839; 257/431–470; 136/243–265
See application file for complete search history.

(56) References Cited

U.S. PATENT DOCUMENTS

| | | | | |
|---|---|---|---|---|
| 4,785,191 A | * | 11/1988 | Ondris | .......................... 358/482 |
| 6,281,427 B1 | * | 8/2001 | Mitsuhiro | ......... H01L 31/02363 136/250 |
| 2005/0121683 A1 | | 6/2005 | Nakata | |

(Continued)

FOREIGN PATENT DOCUMENTS

| | | |
|---|---|---|
| EP | 1467413 A1 | 10/2004 |
| JP | 2010-206004 A | 9/2010 |

(Continued)

OTHER PUBLICATIONS

Yoshifumi Okuno, et al., "Uniform and controllable preparation of Au-Ag core-shell nanorods using anisotropic silver shell formation on gold nanorods," 2010, Nanoscale, vol. 2, pp. 1489-1493.*

Kessler, et al., "Approaches to flexible CIGS thin-film solar cells," Thin Solid Films, vol. 480-481 (2005), pp. 491-498.*

Bardhan, et al., "Metallic Nanoshells with Semiconductor Cores: Optical Characteristics Modified by Core Medium Properties," ACS Nano, vol. 4 (2010), pp. 6169-6179.*

(Continued)

*Primary Examiner* — James Lin
*Assistant Examiner* — William E McClain
(74) *Attorney, Agent, or Firm* — Saliwanchik, Lloyd & Eisenschenk

(57) ABSTRACT

Provided are a solar cell and a method of fabricating the same. The solar cell includes: a substrate; a back electrode layer on the substrate; a light absorbing layer on the rear electrode layer; a window layer on the light absorbing layer; a plurality of beads in the light absorbing layer; and a trap layer on each surface of the plurality of beads.

5 Claims, 2 Drawing Sheets

(56) References Cited

U.S. PATENT DOCUMENTS

| | | | |
|---|---|---|---|
| 2006/0062902 A1* | 3/2006 | Sager et al. | 427/74 |
| 2007/0089782 A1 | 4/2007 | Scheuten et al. | |
| 2007/0092648 A1* | 4/2007 | Duren et al. | 427/255.31 |
| 2007/0175507 A1* | 8/2007 | Dutta | 136/255 |
| 2008/0110494 A1* | 5/2008 | Reddy | 136/255 |
| 2008/0142075 A1* | 6/2008 | Reddy et al. | 136/257 |
| 2010/0006153 A1* | 1/2010 | Rauscher et al. | 136/261 |
| 2010/0031995 A1* | 2/2010 | Herner et al. | 136/244 |
| 2010/0224244 A1* | 9/2010 | Furusawa | 136/256 |
| 2010/0319776 A1 | 12/2010 | Choe et al. | |
| 2010/0326506 A1* | 12/2010 | Lifshitz | H01G 9/2054 136/255 |
| 2011/0024793 A1 | 2/2011 | Jeon | |
| 2011/0065228 A1* | 3/2011 | Li | 438/94 |
| 2012/0031459 A1 | 2/2012 | Kim et al. | |

FOREIGN PATENT DOCUMENTS

| | | | |
|---|---|---|---|
| KP | 10-2009-0029495 A | | 3/2009 |
| KR | 10-2009-0104304 A | | 10/2009 |
| KR | 10-2010-0109312 A | | 10/2010 |
| KR | 10-2010-0109319 A | | 10/2010 |
| WO | WO 2009061134 A1 * | | 5/2009 |

OTHER PUBLICATIONS

Levcenko, et al., "Optical Constants of CuIn1-xGaxSe2 films deposited by flash evaporation," Moldavian Journal of the Physical Sciences, vol. 9 (2010), pp. 148-155.*

Rakić, et al., "Optical properties of metallic films for vertical-cavity optoelectronic devices," Appl. Opt., vol. 37 (1998), pp. 5271-5283.*

Greyer V. et al. "A new approach to the manufacture of chalcogenide thin film solar cells", Thin Solid Films, Elsevier-Sequoia S.A. Lausanne, CH. vol. 516:14. May 30, 2008.

Guilatt O. et al. "Study of LSPR-enhanced absorption for solar cell applications: preliminary results", Proc. of Spie—Nanoscale Photonic and Cell Technologies for Photovoltaics II, vol. 7411, Aug. 20, 2009.

Werner A. et al. "Investigation of the Influence of Silver on the Crystal Growth of CuInS2 thin films", Thin Solid Films, Elsevier-Sequoia S.A. Lausanne, CH. vol. 361-362: 1, pp. 88-92, Feb. 2000.

Supplementary European Search Report in European Application No. 12767495, dated Nov. 14, 2014.

International Search Report in International Application No. PCT/KR2012/002520, filed Apr. 4, 2012.

Office Action dated Nov. 23, 2012 in Korean Application No. 10-2011-0030875, filed Apr. 4, 2011.

* cited by examiner

US 9,306,092 B2

SOLAR CELL AND METHOD OF FABRICATING THE SAME

CROSS-REFERENCE TO RELATED APPLICATIONS

This application is the U.S. national stage application of International Patent Application No. PCT/KR2012/002520, filed Apr. 4, 2012, which claims priority to Korean Application No. 10-2011-0030875, filed Apr. 4, 2011, the disclosures of each of which are incorporated herein by reference in their entirety.

TECHNICAL FIELD

The present disclosure relates to a solar cell and a method of fabricating the same.

BACKGROUND ART

As the need for energy is increased recently, development on a solar cell that converts solar energy into electrical energy is in progress.

Especially, a Copper Indium Gallium Selenide (CIGS) based solar cell, i.e., a pn-hetero junction device having a substrate structure including a glass substrate, a metallic back electrode layer, a p-type CIGS based light absorbing layer, a high resistance buffer layer, and an n-type transparent electrode layer, is widely being used nowadays.

Additionally, a variety of research is under way to increase the efficiency of the solar battery.

DISCLOSURE OF INVENTION

Technical Problem

Embodiments provide a solar cell having improved photoelectric conversion efficiency and a method of fabricating the same.

Solution to Problem

In one embodiment, a solar cell includes: a substrate; a back electrode layer on the substrate; a light absorbing layer on the rear electrode layer; a window layer on the light absorbing layer; a plurality of beads in the light absorbing layer; and a trap layer on each surface of the plurality of beads.

In another embodiment, a method of fabricating a solar cell includes: forming a plurality of beads by pulverizing a CIGS crystal; forming a trap layer on each surface of the plurality of beads; forming a back electrode layer on a substrate; sputtering the plurality of beads on the back electrode layer; forming a light absorbing layer on the back electrode layer and the plurality of beads; forming a buffer layer on the light absorbing layer; and forming a window layer on the buffer layer.

Advantageous Effects of Invention

According to embodiments, a plurality of beads are formed in a light absorbing layer, and a trap layer is formed on the surfaces of the plurality of beads, so that a light incident to the inside of the plurality of beads does not exit to an external due to the trap layer, and thus, is absorbed therein. As a result, photoelectric conversion efficiency may be improved.

BEST MODE FOR CARRYING OUT THE INVENTION

Figure 1:
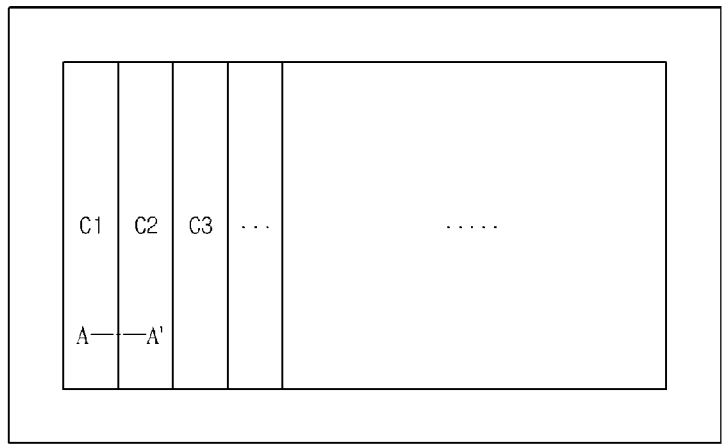
FIG. 1 is a plan view of a solar cell according to an embodiment.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Further, the reference about 'on' and 'under' each layer will be made on the basis of drawings. In the drawings, the thickness or size of each layer is exaggerated, omitted, or schematically illustrated for convenience in description and clarity. Also, the size of each element does not entirely reflect an actual size.

Figure 2:
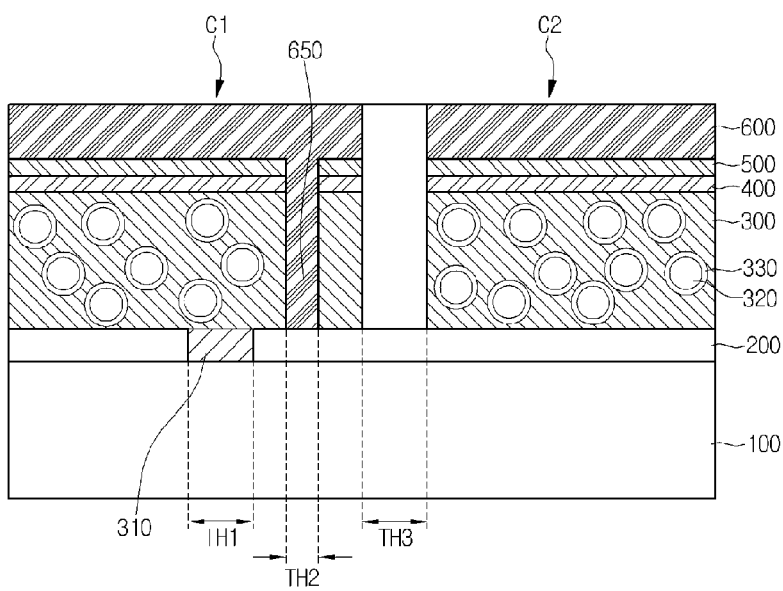
FIG. 2 is a sectional view taken along the line A-A' of FIG. 1.

FIG. 1 is a plan view of a solar cell according to an embodiment. FIG. 2 is a sectional view taken along the line A-A' of FIG. 1.

Referring to FIGS. 1 and 2, the solar cell according to an embodiment includes a supporting substrate 100, a back electrode layer 200, a light absorbing layer 300, a buffer layer 400, a high resistance buffer layer 500, and a window layer 600.

A plurality of beads 320 and a trap layer coating on the surfaces of the plurality of beads 320 may be formed in the light absorbing layer 300.

The supporting substrate 100 has a plate shape, and supports the back electrode layer 200, the light absorbing layer 300, the buffer layer 400, the high resistance buffer layer 500, and the window layer 600.

The supporting substrate 100 may be an insulator. The supporting substrate 100 may be a glass substrate, a plastic substrate, or a metallic substrate. In more detail, the supporting substrate 100 may be a soda lime glass substrate. The supporting substrate 100 may be transparent. The supporting substrate 100 may be rigid or flexible.

The back electrode layer 200 is disposed on the supporting substrate 100. The back electrode layer 200 is a conductive layer. An example of a material used for the back electrode layer 200 is metal such as molybdenum.

Additionally, the back electrode layer 200 may include at least two layers. At this point, each of the layers may be formed of the same or different metal.

A first through hole TH1 is formed in the back electrode layer 200. The first through holes TH1 are open areas exposing the top surface of the supporting substrate 100. Seen from the top, the first through holes TH1 may have a shape extending in one direction.

Each width of the first through holes TH1 may be about 80 μm to about 200 μm.

The back electrode layer 200 is divided into a plurality of back electrodes by the first through hole TH1. That is, the first through holes TH1 defines the back electrodes.

The back electrodes are spaced from each other by the first through holes TH1. The back electrodes are disposed in a stripe shape.

An insulating layer 310 may be formed to fill the first through holes TH1. The insulating layer 310 may be formed including $SiO_2$. When the plurality of beads 320 are formed in the first through holes TH1, a first cell C1 may be electrically connected to a second cell C2 by the trap layer 330 coating on the surfaces of the plurality of beads 320. In order to prevent that, the insulating layer 310 may be formed.

The back electrodes are disposed in a matrix. At this point, seen from the top, the first through holes TH1 may be formed in a lattice.

The light absorbing layer 300 is disposed on the back electrode layer 200.

The light absorbing layer 300 includes a Group I-III-VI based compound. For example, the light absorbing layer 300 may have a Cu(In,Ga)Se$_2$ (CIGS) based crystal structure, a copper-indium-selenide based crystal structure, or a copper-gallium-selenide crystal structure.

An energy band gap of the light absorbing layer 300 may be about 1 eV to about 1.8 eV.

Additionally, the light absorbing layer 300 defines a plurality of light absorbing parts by a second through hole TH2. That is, the light absorbing layer 300 is divided into the plurality of light absorbing parts by the second through hole TH2.

A plurality of beads 320 may be formed in the light absorbing layer 300. The plurality of beads 320 includes the same Group I-III-VI based compound as the light absorbing layer 300. For example, the light absorbing layer 320 may have a Cu(In,Ga)Se$_2$ (CIGS) based crystal structure, a copper-indium-selenide based crystal structure, or a copper-gallium-selenide crystal structure.

Each of the plurality of beads 320 may be formed with a diameter of about 0.8 μm to about 1.2 μm. The plurality of beads 320 may be formed in a spherical shape overall, but is not limited thereto.

The trap layer 330 may be formed on the surfaces of the plurality of beads 320. The trap layer 330 may include metal, for example, Ag.

The trap layer 330 may be formed with a thickness of about 3 nm to about 7 nm. The trap layer 330 prevents a light incident into the plurality of beads 320 from being reflected to an external again, so that it allows the light to be absorbed in the plurality of beads 320.

If the trap layer 330 is thick, light may be absorbed in the trap layer 330, and if the trap layer 330 is thin, light trap effect is small, so that a ratio of each diameter of the plurality of beads 320 and the thickness of the trap layer 330 may be 200:1.

The light absorbing layer 300 may be formed with a thickness, which is two to three times greater than each diameter of the plurality of beads 320.

The buffer layer 400 is disposed on the light absorbing layer 300. The buffer layer 400 includes CdS, and its energy band gap is about 2.2 eV to about 2.4 eV.

The high resistance buffer layer 500 is disposed on the buffer layer 400. The high resistance buffer layer 500 includes i-ZnO undoped with an impurity. An energy band gap of the high resistance buffer layer 500 is about 3.1 eV to about 3.3 eV.

A plurality of second thorough holes TH2 are formed in the light absorbing layer 300, the buffer layer 400, and the high resistance buffer layer 500. The second through holes TH2 are open areas exposing the top surface of the back electrode layer 200.

The second through hoes TH2 are formed adjacent to the first through holes TH1. That is, seen from the top, part of the second through holes TH2 are formed near the first through holes TH1.

Each width of the second through holes TH2 may be about 80 μm to about 200 μm.

The window layer 600 is disposed on the high resistance buffer layer 500. The window layer 600 is a transparent conductive layer. Additionally, the window layer 600 has a higher resistance than the back electrode layer 200. For example, the window layer 600 may have a resistance, which is about 10 to about 200 times greater than that of the back electrode layer 200.

The window layer 600 may include an oxide. For example, the window layer 600 may include a zinc oxide, an indium tin oxide (ITO), or an indium zinc oxide (IZO).

Additionally, the oxide may include a conductive impurity such as Al, Al2O3, Mg, or Ga. In more detail, the window layer 600 may include an Al doped zinc oxide (AZO) or a Ga doped zinc oxide (GZO).

A connection part 650 is disposed in the second through hole TH2. The connection part 650 extends downward from the window layer 600, and contacts the back electrode layer 200. For example, the connection part 650 extends from the window of the first cell to contact the back electrode of the second cell.

Accordingly, the connection part 650 connects respectively adjacent cells. In more detail, the connection part 650 connects the windows in the respectively adjacent cells C1, C2, . . . with the back electrode.

The connection part 650 and the window layer 600 are integrally formed. That is, the connection part 650 is formed of the same material as the window layer 600.

A plurality of third through holes TH3 are formed in the buffer layer 400, the high resistance buffer layer 500, and the window layer 600. The third through holes TH3 are open areas exposing the top surface of the back electrode layer 200. For example, each width of the third through holes TH3 may be about 80 μm to about 200 μm.

The third through hoes TH3 are formed adjacent to the second through holes TH2. In more detail, the third through holes TH3 are disposed near the second through holes TH2. That is, seen from the top, the third through holes TH3 are disposed alongside the second through holes TH2.

The buffer layer 400 is divided into a plurality of buffers by the third through holes TH3.

In the same manner, the high resistance buffer layer 500 is divided into a plurality of high resistance buffers by the third through holes TH3.

Additionally, the window layer 600 is divided into a plurality of windows by the third through holes TH3. That is, the windows are defined by the third through holes TH3.

The windows have shapes corresponding to the back electrodes. That is, the windows are disposed in a stripe shape. Unlike this, the windows may be disposed in a matrix.

Additionally, a plurality of cells C1, C2, . . . are defined by the through holes TH3. In more detail, the cells C1, C2, . . . are defined by the second through holes TH2 and the third through holes TH3. That is, the solar cell according to an embodiment includes the cells C1, C2, . . . divided by the second through holes TH2 and the third through holes TH3.

As mentioned above, the plurality of beads 320 are formed in the light absorbing layer 300, and the trap layer 330 is formed on the surfaces of the plurality of beads 320, so that a light incident into the plurality of beads 320 does not exit to an external by the trap layer 330 and is absorbed in the plurality of beads 320. As a result, photo-electric conversion efficiency may be improved.

FIGS. 3 to 7 are sectional views illustrating a method of fabricating a solar cell according to an embodiment. Description of the fabricating method refers to that of the above-mentioned solar cell.

Figure 3:
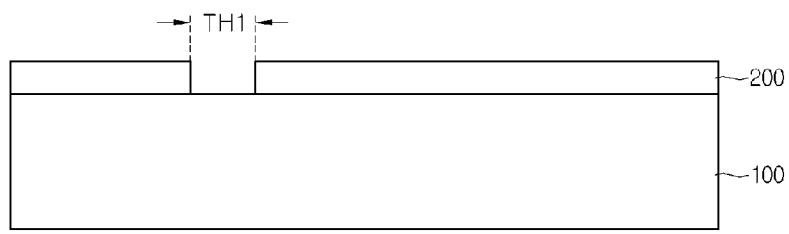
FIGS. 3 to 7 are sectional views illustrating a method of fabricating a solar cell according to an embodiment.

Referring to FIG. 3, the back electrode layer 200 is formed on the supporting substrate 100, and the back electrode layer 200 is patterned to form the first through holes TH1. Accordingly, a plurality of back electrodes are formed on the supporting substrate 100. The back electrode layer 200 is patterned using laser.

The first through holes TH1 expose the top surface of the supporting substrate 100, and may have a width of about 80 µm to about 200 µm.

Additionally, an additional layer such as a diffusion preventing layer may be interposed between the supporting substrate 100 and the back electrode layer 200, and at this point, the first through holes TH1 exposes the top surface of the additional layer.

Figure 4:
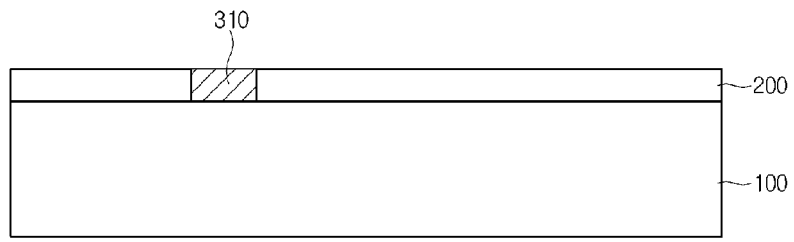

Referring to FIG. 4, the insulating layer 310 may be formed to fill the first through holes TH1. The insulating layer 310 may be formed including $SiO_2$. When the plurality of beads 320 are formed in the first through holes TH1, a first cell C1 may be electrically connected to a second cell C2 by the trap layer 330 coating on the surfaces of the plurality of beads 320. In order to prevent that, the insulating layer 310 may be formed.

Figure 5:
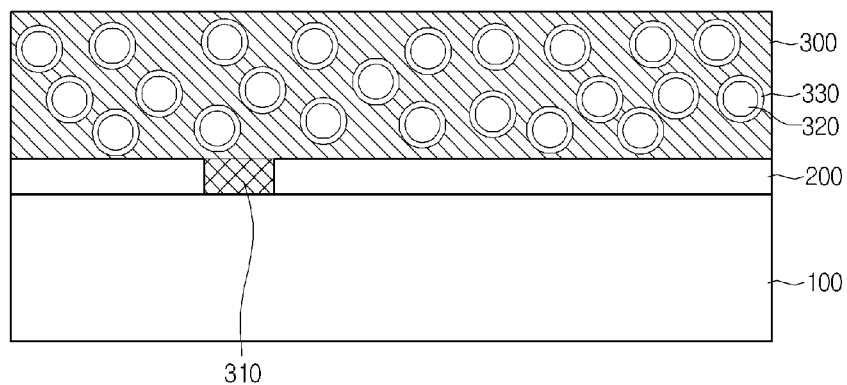

Referring to FIG. 5, after the trap layer 330 is formed on the surfaces of the plurality of beads 320, the plurality of beads 320 are formed on the back electrode layer 200 through a sputtering method.

The plurality of beads 320 are separated after forming a CIGS based crystal and pulverizing it while evaporating copper, indium, gallium, and selenium simultaneously or separately. The plurality of beads 320 may be formed in a spherical shape overall, but is not limited thereto.

The trap layer 330 may be formed by dipping the plurality of beads 320 in an aqueous solution including a metallic material, such as an AgCl aqueous solution. Through the above process, the trap layer 330 including Ag may be formed on the surfaces of the plurality of beads 320. The plurality of beads 320 and the trap layer 330 may be formed of materials having respectively different refractive indices.

After scattering the plurality of beads 320 having the trap layer 330 on the back electrode layer 200, the light absorbing layer 300 may be formed through a sputtering process or evaporation method.

For example, methods of forming the CIGS based light absorbing layer 300 by evaporating copper, indium, gallium, and selenium simultaneously or separately, or performing a selenization process after forming a metallic precursor layer are widely used currently.

If forming and then selenizing a metallic precursor layer is described in detail, the metallic precursor layer is formed on the back electrode 200 through a sputtering process using a copper target, an indium target, and a gallium target.

Then, the metallic precursor layer becomes the CIGS based light absorbing layer 300 through a selenization process.

Unlike this, the sputtering process using a copper target, an indium target, and a gallium target and the selenization process may be performed simultaneously.

Unlike this, the CIS based or CIG based light absorbing layer 300 may be formed through a sputtering process using only copper and indium targets or only copper and gallium targets and a selenization process.

Figure 6:
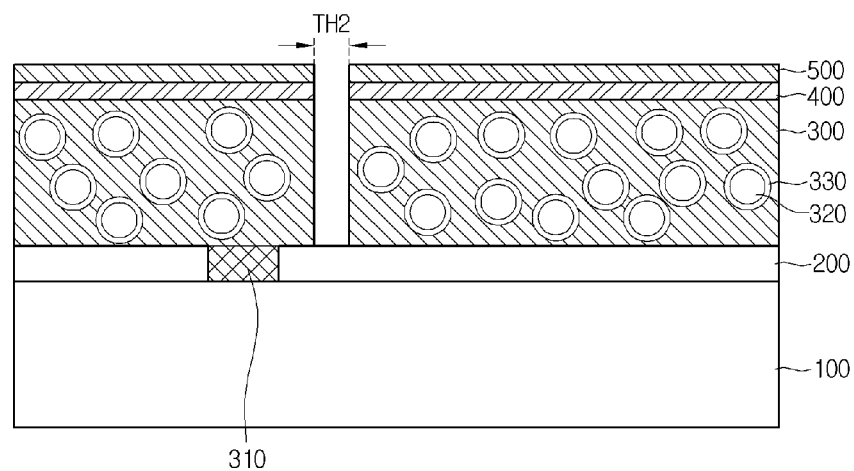

Referring to FIG. 6, the buffer layer 400 and the high resistance buffer layer 500 are formed on the light absorbing layer 300.

The buffer layer 400 is formed when cadmium sulfide is deposited on the light absorbing layer 300 through a sputtering process or Chemical Bath Deposition (CBD).

Then, a zinc oxide is deposited on the buffer layer 400 through a sputtering process, and then, the high resistance buffer layer 500 is formed.

The buffer layer 400 and the high resistance buffer layer 500 are deposited with a thin thickness. For example, each of the buffer layer 400 and the high resistance buffer layer 500 has a thickness of about 1 nm to about 80 nm.

Then, the light absorbing layer 300, the buffer layer 400, and the high resistance buffer layer 500 are partially removed to form the second through holes TH2.

The second through holes TH2 may be formed through a mechanical device such as a tip or a laser device.

For example, the light absorbing layer 300 and the buffer layer 400 may be patterned through a tip having a width of about 40 µm to about 180 µm. Additionally, the second through holes TH2 may be formed through a laser having a wavelength of about 200 nm to about 600 nm.

At this point, each width of the second through holes TH2 may be about 100 µm to about 200 µm. Moreover, the second through holes TH2 are formed to expose a portion of the top surface of the back electrode layer 200.

Figure 7:
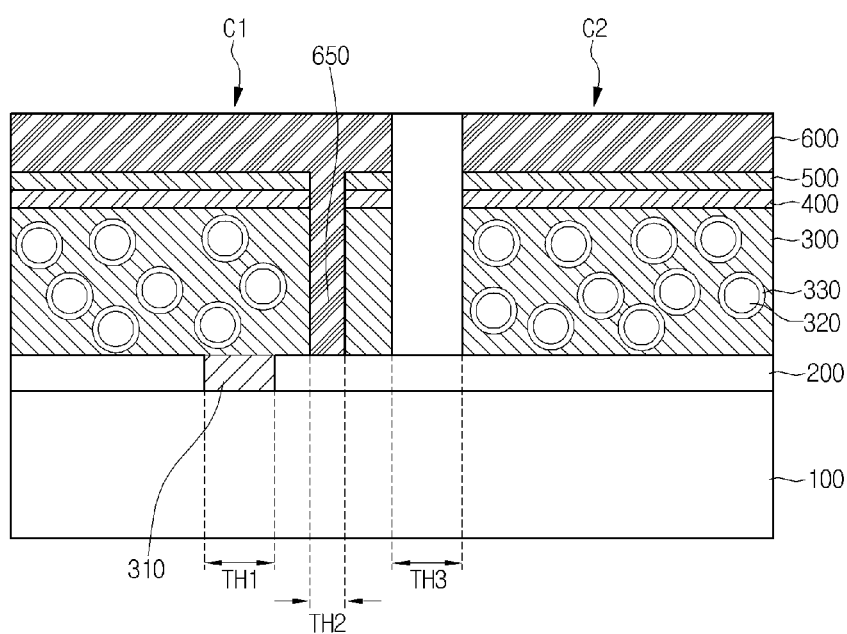

Referring to FIG. 7, the window layer 600 is formed on the light absorbing layer 300 and in the second through holes TH2. That is, the window layer 600 is formed after a transparent conductive material is deposited on the high resistance buffer layer 500 and in the second through holes TH2.

At this point, the inside of the second through holes TH2 is filled with the transparent conductive material, and the window layer 600 directly contacts the back electrode layer 200.

At this point, the window layer 600 may be formed when the transparent conductive material is deposited under an oxygen-free atmosphere. In more detail, the window layer 600 may be formed when an aluminum-doped zinc oxide is deposited under an inert gas atmosphere without oxygen.

In relation to a method of fabricating a solar cell according to an embodiment, a plurality of beads are formed in a light absorbing layer, and a trap layer is formed on the surfaces of the plurality of beads, so that a light incident to the inside of the plurality of beads does not exit to an external due to the trap layer, and thus, is absorbed therein. As a result, photoelectric conversion efficiency may be improved.

Additionally, the features, structures, and effects described in the above embodiments are included in at least one embodiment, but the present invention is not limited thereto. Furthermore, the features, structures, and effects in each embodiment may be combined or modified for other embodiments by those skilled in the art Accordingly, contents regarding the combination and modification should be construed as being in the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a substrate;
   a rear electrode layer on the substrate;
   a light absorbing layer on the rear electrode layer;
   a window layer on the light absorbing layer;
   a plurality of beads in the light absorbing layer;
   a trap layer formed on a surface of each of the plurality of beads to inhibit a light incident into the plurality of beads from being reflected out of the trap layer, wherein a ratio between a diameter of each bead of the plurality of beads and a thickness of the trap layer is 200:1;

wherein each bead of the plurality of beads has a diameter between 0.8 and 1.2;

wherein the trap layer has a thickness of 3 nm to 7 nm;

wherein the plurality of beads and the trap layer are formed of materials having different refractive indices;

first through holes formed in a portion of the rear electrode layer to expose a portion of a top surface of the substrate;

an insulating layer filling up the first through holes; and second through holes formed on the rear electrode layer for separating the light absorbing layer into two parts, the second through holes being filled with a same material as that of the window layer;

wherein the plurality of beads includes a Group I-III-VI based compound.

2. The solar cell according to claim 1, wherein the plurality of beads comprises at least one of a Copper Indium Gallium Selenide (CIGS) base, a Copper Indium Selenide (CIS) base, and a Copper Gallium Selenide (CGS) base.

3. The solar cell according to claim 1, wherein the trap layer comprises metal.

4. The solar cell according to claim 1, wherein the insulating layer comprises $SiO_2$.

5. The solar cell according to claim 1, wherein the light absorbing layer is formed with a thickness that is two to three times greater than a diameter of each bead of the plurality of beads.

* * * * *